_United States Patent_ [19]

Kasper

[11] 4,344,803
[45] Aug. 17, 1982

[54] PHOTO CATHODE MADE FROM COMPOSITE SEMICONDUCTOR/GLASS MATERIAL

[75] Inventor: Erich Kasper, Senden, Fed. Rep. of Germany

[73] Assignee: Licentia Patent-Verwaltungs-G.m.b.H., Frankfurt am Main, Fed. Rep. of Germany

[21] Appl. No.: 130,124

[22] Filed: Mar. 13, 1980

[30] Foreign Application Priority Data

Mar. 14, 1979 [DE] Fed. Rep. of Germany ....... 2909956

[51] Int. Cl.³ .................... H01L 29/36; H01L 31/00
[52] U.S. Cl. ................................ 148/33.3; 29/572; 148/33.1; 357/4; 357/30; 357/89; 427/74; 428/428; 428/432
[58] Field of Search ............... 29/572; 148/33.1, 33.3; 313/94, 102; 357/4, 30, 89, 90, 31; 427/74, 87; 428/426, 428, 432

[56] References Cited

U.S. PATENT DOCUMENTS

| | | | |
|---|---|---|---|
| 3,287,611 | 11/1966 | Bockemuehl et al. | 357/30 X |
| 3,289,024 | 11/1966 | De Haan et al. | 313/94 X |
| 3,458,782 | 7/1969 | Buck et al. | 357/31 |
| 3,460,240 | 8/1969 | Tarneja et al. | 29/572 |
| 3,502,884 | 3/1970 | Perlman et al. | 357/30 X |
| 3,548,233 | 12/1970 | Cave et al. | 357/31 X |
| 3,575,628 | 4/1971 | Word | 313/94 |
| 3,631,303 | 12/1971 | Antypas et al. | 357/30 |
| 3,769,536 | 10/1973 | Antypas et al. | 313/94 |
| 4,086,102 | 4/1978 | King | 357/30 |

FOREIGN PATENT DOCUMENTS 2842492 9/1978 Fed. Rep. of Germany .

_Primary Examiner_—L. Dewayne Rutledge
_Assistant Examiner_—W. G. Saba
_Attorney, Agent, or Firm_—Spencer & Kaye

[57] ABSTRACT

A composite semiconductor/glass material comprising at least one semiconductor layer permanently connected to a plate shaped glass substrate, the doping of the semiconductor layer rising from a minimum at its surface away from the glass substrate to a maximum adjacent the glass substrate.

6 Claims, 3 Drawing Figures

PHOTO CATHODE MADE FROM COMPOSITE SEMICONDUCTOR/GLASS MATERIAL

BACKGROUND OF THE INVENTION

The invention relates to a composite semiconductor/glass material in which at least one semiconductor layer is permanently connected to a glass substrate.

SUMMARY OF THE INVENTION

It is an object of the present invention to provide a composite semiconductor/glass material in which, in the border region between the glass and the semiconductor component, recombination of the minority charge carriers is reduced.

According to a first aspect of the invention, there is provided a composite semiconductor/glass material comprising a glass substrate and a semiconductor layer which is permanently connected or bonded to the glass substrate and which has a doping concentration with a minimum value at a part of the semiconductor layer away from the glass substrate and a maximum value at the surface of the semiconductor layer adjacent the glass substrate.

According to a second aspect of the invention, there is provided a composite semiconductor/glass material in which a least one semiconductor layer is permanently connected to a plate-shaped glass substrate, wherein the semiconductor layer has homogenous doping $N=N_o$ in a layer region which is remote from the glass substrate; the doping in a part of the semiconductor layer increases starting from the value $N=N_o$ continuously, in the direction of the surface normals of the semiconductor layer, as the spacing from the semiconductor/glass interface decreases up to a value of $N=N_s$ at the surface of the semiconductor layer adjacent the glass substrate and $N_s > 30 \, N_o$.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
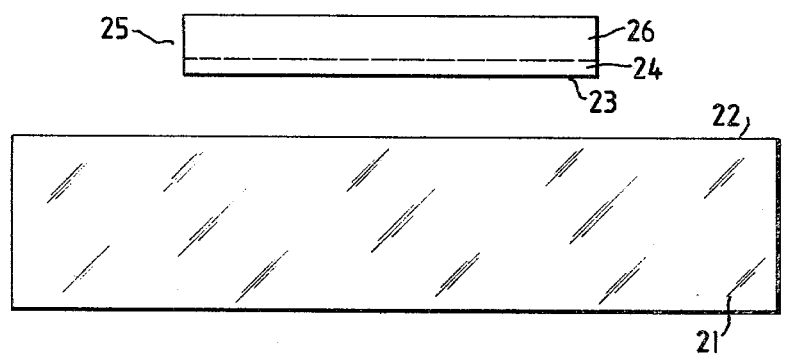
FIG. 1 shows a semiconductor layer and a glass substrate in a schematic side view as components of a composite/semiconductor/glass material.

FIG. 1 shows the components of a composite/semiconductor/glass material with the glass substrate 21 and the semiconductor layer 25. The semiconductor layer 25 and the glass substrate 21 are placed one on the other with their surfaces 23 and 22 in contact as described, for example, in the earlier Federal Republic of Germany Patent Application No. P 28 42 492.2 corresponding to U.S. Pat. Application Ser. No. 80,948, filed Oct. 1, 1979, now U.S. Pat. No. 4,311,743, and are connected together by application of pressure and heat. This type of composite/semiconductor/glass material is used as a photocathode, for example, in an image converter or image intensifier tube. In order to achieve an improvement in the optoelectronic properties of these cathodes, an attempt must be made to reduce the recombination of minority charge carriers at the interface layer between the semiconductor layer and the glass substrate.

This can be achieved, in accordance with the invention, by the semiconductor layer 25 having layer regions 24, 26 which have different proportions of doping agent. In the layer region 26 of the semiconductor layer 25 which is remote from the interface between the semiconductor layer and the glass substrate, the concentration of the doping agent is constant and has the value $N=N_o$. Starting from this value the proportion of the doping agent increases continuously in the direction of the surface normals of the semiconductor layer 25 as the spacing from the semiconductor/glass interface 22, 23 decreases, in a part 24 of the semiconductor layer 25, up to a value of $N=N_s$ at the surface 23 of the semiconductor layer 25 adjacent the glass substrate 21. The curve for the proportion of doping agent, N, is shown as a function of the spacing z from the interface area between the semiconductor layer 25 and the glass substrate 21 in FIG. 3.

Particularly good properties are achieved in the composite/semiconductor/glass material if the concentration $N_s$ of doping agent at the outer surface 23 of the semiconductor layer 24, adjacent the glass substrate, is more than approximately thirty (30) times the doping agent concentration $N_o$ in the region 26 of the semiconductor layer 25.

Figure 2:
FIG. 2 shows a diagram of the energy band of the semiconductor layer.
Figure 2:
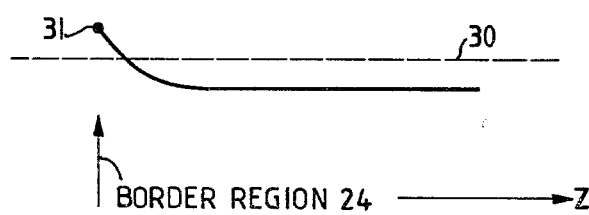
Figure 3:
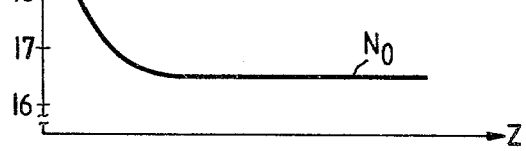
FIG. 3 shows the doping distribution in the semiconductor layer, in the form of a diagram, as a function of the spacing from the interface between the semiconductor layer and the glass substrate.

The minority charge carriers (electrons) are reflected by the layer 24 of the semiconductor layer 25 because of the distribution of the doping agent shown in FIG. 3. This is made clear by the diagram of the energy band of the semiconductor layer shown in FIG. 2. In this Figure, the Fermi level is designated 30. The reference numbers 31 and 32 represent the edge of the valency band or the edge of the conduction band respectively. This type of arrangement of the energy level is a p-doped semiconductor layer causes the minority charge carriers (electrons) to be reflected at the layer 24 with the result that a reduction in the recombination of minority charge carriers is achieved in the border region between the semiconductor layer 25 and the glass substrate 21. The thickness of the layer 24 is preferrably chosen between 10 and 100 nanometers.

The proportions of doping agent may be introduced into the layer 24 by means of ion implantation in a particularly favourable manner.

However the curve for the proportion of doping agent in semiconductor layer 25 may be affected by a diffusion process. In a preferred manner the diffusion is implemented so that the outer surface of the semiconductor layer 25 which limits the layer 24 is covered by a silicon dioxide layer enriched with a doping substance at least during the diffusion process. This silicon dioxide layer is removed in a manner known per se once the diffusion process has been completed.*

*The doping processes are performed before connecting the semiconductor layer with the glass substrate.

It will be understood that the above description of the present invention is susceptible to various modification changes and adaptions.

What is claimed is:

1. A photocathode comprising: a plate-shaped glass substrate; a semiconductor layer having opposed first and second major surfaces with said first major surface being planar and permanently bonded to a surface of said glass substrate through the use of pressure and increased temperature, said semiconductor layer consisting of semiconductor material of a single conductivity type and having a first layer region extending along the entire said second major surface with a homogeneous doping concentration $N=N_o$ and with the remaining portion of said semiconductor layer having a doping concentration which continuously increases with decreasing distance from said first major surface, in a direction normal to same, from said value of $N=N_o$ up to a value of $N=N_s$ at said first major surface, where $N_s>30\ N_o$.

2. A photocathode as defined in claim 1 wherein said remaining portion of said semiconductor layer has a thickness of approximately 10 to 100 nanometers.

3. A photocathode as defined in claim 1 or 2 wherein said semiconductor layer is of a p-type conductivity.

4. A photocathode as defined in claim 1, wherein said remaining portion of said semiconductor layer is produced by means of ion implantation.

5. A photocathode as defined in claim 1, wherein said remaining portion of said semiconductor layer is produced by diffusion.

6. A photocathode as defined in claim 1, wherein during the diffusion process, the outer surface (23) of said remaining portion of said semiconductor layer is covered by a silicon dioxide coating enriched with a doping substance.

* * * * *